United States Patent
Coker et al.

(10) Patent No.: US 6,219,814 B1
(45) Date of Patent: *Apr. 17, 2001

(54) METHOD AND APPARATUS FOR SELECTIVELY VARYING ERROR CORRECTING CODE (ECC) POWER IN A DIRECT ACCESS STORAGE DEVICE (DASD)

(75) Inventors: Jonathan Darrel Coker; Richard Greenberg, both of Rochester, MN (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/772,307

(22) Filed: Dec. 23, 1996

(51) Int. Cl.[7] .................... G11C 29/00; H03M 13/00
(52) U.S. Cl. ...................... 714/763; 714/769; 714/774
(58) Field of Search .................... 714/769, 774, 714/763

(56) References Cited

U.S. PATENT DOCUMENTS

| | | | |
|---|---|---|---|
| 4,195,320 | * 3/1980 | Andresen | 360/78 |
| 4,456,993 | * 6/1984 | Taniguchi et al. | 371/10 |
| 4,493,081 | 1/1985 | Schmidt | 371/38 |
| 4,706,250 | 11/1987 | Patel | 371/39 |
| 4,833,679 | 5/1989 | Anderson et al. | 371/38 |
| 4,916,701 | 4/1990 | Eggenberger et al. | 371/37.7 |
| 4,951,284 | 8/1990 | Abdel-Ghaffar et al. | 371/38.1 |
| 4,993,029 | 2/1991 | Galbraith et al. | 371/40.1 |
| 5,003,542 | 3/1991 | Mashiko et al. | 371/40.1 |
| 5,233,482 | * 8/1993 | Galbraith et al. | 360/46 |
| 5,267,241 | * 11/1993 | Kowal | 714/706 |
| 5,321,703 | * 6/1994 | Weng | 371/36 |
| 5,384,786 | 1/1995 | Dudley et al. | 371/37.1 |
| 5,390,195 | 2/1995 | Brush | 371/37.1 |
| 5,404,361 | 4/1995 | Casorso et al. | 371/40.1 |
| 5,416,787 | * 5/1995 | Kodama et al. | 371/43 |
| 5,432,801 | * 7/1995 | Hepler | 714/769 |
| 5,444,719 | * 8/1995 | Cox et al. | 714/774 |
| 5,446,744 | 8/1995 | Nagasawa et al. | 371/37.4 |
| 5,455,536 | 10/1995 | Kono et al. | 329/325 |
| 5,467,361 | * 11/1995 | Shipman, Jr. | 714/766 |
| 5,615,190 | * 3/1997 | Best et al. | 369/58 |

(List continued on next page.)

FOREIGN PATENT DOCUMENTS

| | | | |
|---|---|---|---|
| 0608637A1 | 8/1994 | (EP) | H03M/13/00 |
| 0747818A1 | 12/1996 | (EP) | G06F/11/10 |

OTHER PUBLICATIONS

Enhanced Addressing Error Detection System, J.M. Karp and S.C. West, IBM Technical Disclosure Bulletin, vol. 34, No. 7B, Dec. 1991, pp. 31–37.

Fully Self–Contained Memory Card Extended Error Checking/Correcting Hardware Implementation, D.L. Arlington, E.K. Evans, D.A. Kleinman, W.L. Mostowy, and A.F. Weaver, IBM Technical Disclosure Bulletin, vol. 31, No. 5, Oct. 1988, pp. 352–355.

*Primary Examiner*—William Grant
*Assistant Examiner*—Iván Calcaño
(74) *Attorney, Agent, or Firm*—Joan Pennington

(57) ABSTRACT

A method and apparatus are provided for utilizing error correction code (ECC) in a direct access storage device (DASD). A plurality of predetermined file conditions are identified. Each of the plurality of predetermined file conditions are related to a read data raw error rate. An ECC burst control is provided with an ECC engine for varying an ECC correction power of the ECC engine. The ECC correction power is selectively varied responsive to the identified predetermined file conditions.

18 Claims, 7 Drawing Sheets

U.S. PATENT DOCUMENTS

| | | | |
|---|---|---|---|
| 5,659,557 | * | 8/1997 | Glover et al. ......................... 371/37.1 |
| 5,737,365 | * | 4/1998 | Gilbert et al. ......................... 375/224 |
| 5,745,268 | * | 4/1998 | Eastvold et al. ..................... 359/110 |
| 5,754,563 | * | 5/1998 | White ................................... 371/376 |
| 5,768,044 | * | 6/1998 | Hetzler et al. ......................... 360/77 |
| 5,781,565 | * | 7/1998 | Sako et al. ............................ 714/758 |
| 6,038,679 | * | 3/2000 | Hanson .................................... 714/5 |
| 6,067,203 | * | 5/2000 | Ottensen et al. ....................... 360/73 |
| 6,125,469 | * | 9/2000 | Zook et al. ............................ 714/769 |

\* cited by examiner

FIG.5

CUSTOMER DATA BLOCK (WITH OVERHEAD)

| SYNC FIELD | SYNC MARK | 512B CUSTOMER DATA | 4B CRC | 4B CRC | 18B R-S ECC 6B/INTERLEAVE 3 WAY INLEAVE |
|---|---|---|---|---|---|

FIG.6

| | CORRECTION POWER ENABLED | | |
|---|---|---|---|
| | 1 BURST/ INTERLEAVE | 2 BURST/ INTERLEAVE | 3 BURST/ INTERLEAVE |
| 18 BYTE RS ECC 8-BIT/SYMBOL 3 WAY INT. | 1.6E-10 | 3.6E-06 | 5.4E-02 |
| 18 BYTE RS ECC 8-BIT/SYMBOL 3 WAY INT. PLUS ONE-4 BYTE CRC DETECTOR | 3.8E-20 | 8.5E-16 | 1.3E-11 |
| 18 BYTE RS ECC 8-BIT/SYMBOL 3 WAY INT. PLUS TWO-4 BYTE CRC DETECTORS | 8.7E-30 | 2.0E-25 | 3.0E-21 |

|  | 1 BURST/ INTERLEAVE ONTRACK/SETTLE | 2 BURST/ INTERLEAVE ONTRACK/SETTLE | 3 BURST/ INTERLEAVE ONTRACK/SETTLE |
|---|---|---|---|
| 18 BYTE RS ECC 8-BIT/SYMBOL 3 WAY INT. | 3.1E-19/1.6E-13 | 7.1E-15/3.6E-09 | 1.1E-10/5.3E-05 |
| 18 BYTE RS ECC 8-BIT/SYMBOL 3 WAY INT. PLUS ONE-4 BYTE CRC DETECTOR | 7.2E-29/3.7E-23 | 1.7E-24/8.3E-19 | 2.5E-20/1.2E-14 |
| 18 BYTE RS ECC 8-BIT/SYMBOL 3 WAY INT. PLUS TWO-4 BYTE CRC DETECTORS | 1.7E-38/8.5E-33 | 3.9E-34/1.9E-28 | 5.8E-30/2.9E-24 |

FIG.7

METHOD AND APPARATUS FOR SELECTIVELY VARYING ERROR CORRECTING CODE (ECC) POWER IN A DIRECT ACCESS STORAGE DEVICE (DASD)

FIELD OF THE INVENTION

The present invention relates to a direct access storage device (DASD), and more particularly to method and apparatus for utilizing error correction code (ECC) in a direct access storage device (DASD).

DESCRIPTION OF THE PRIOR ART

Disk drive units incorporating stacked, commonly rotated rigid magnetic disks are used for storage of data in magnetic form on the disk surfaces. Data is recorded in radially spaced data information tracks arrayed on the surfaces of the disks. Transducer heads driven in a path toward and away from the drive axis write data to the disks and read data from the disks.

In direct access storage devices (DASDs), it is necessary to position the transducer heads over data tracks on the disk surfaces to properly record and retrieve data. Typically this is accomplished by providing servo information on one or more disk surfaces for reading by the transducer heads. In a fixed block architecture (FBA) each data information track is divided into a predetermined number of equal-sized sectors. Each data sector typically has an identification (ID) field associated with it. The ID field contains information which identifies the data sector, and other information, such as flags to indicate defective sectors. Typically an addressing scheme is used where the data sectors are identified to the host system by a logical block number (LBN). The host computer sends a list of logical block numbers to be written or read. The disk drive controller converts the LBNs into zone, cylinder, head and sector (ZCHS) values. The servo system seeks to the desired zone, cylinder and head, and the disk drive begins reading ID fields until a match is found. Once the appropriate ID field has been read, the disk drive then reads or writes the following data field.

The assignee of the present application has provided a sector format that eliminates ID fields, referred to as the No-ID sector format. In the No-ID sector format, the servo system is used to locate physical sectors, and a defect map is stored in solid state random access memory (RAM) to identify logical sectors. The disk data controller converts logical block numbers to physical block numbers. The servo system is used to locate the physical sector, based upon knowledge of the track formats in each zone. This information includes the locations of any data field splits due to embedded servo, which are also stored in RAM. Both the header and data field split information are stored in RAM, not on the disk.

Well known in the art of disk drive design is the use of error correcting codes (ECC) on the fly (OTF) to correct read errors without suffering a performance degradation. There are conditions where the customer data read error rate is significantly degraded, in particular during settle. In past HDD designs reading during settle did degrade the ECC miscorrection rate OTF, but to a smaller degree. In the case of a read during settle, the read was started very early (i.e. very far from the track center line) for improved performance. Past designs required that a sector ID must be read successfully to insure that the read head was near on track so reading the customer data could be attempted with insignificant degradation in error rate. Today many drives do not employ sector ID's written prior to the customer data, however the early read after settle is still desirable for performance. Because of the NO ID formats the drive designers implementing the OTF ECC can no longer rely on good error rates at all times. In fact the normal on track error rates can be degraded as much as 5 or 6 orders of magnitude, making the possibility of miscorrecting data during settle operations very likely. A need exists to protect the customer from receiving the wrong data undetected, in all cases.

A need exists for an improved method and apparatus for utilizing error correction code (ECC) in a DASD.

SUMMARY OF THE INVENTION

A principal object of the present invention is to provide an improved method and apparatus for effectively utilizing error correcting code (ECC) in a direct access storage device. Other objects are to provide such method and apparatus for effectively utilizing error correcting code (ECC) substantially without negative effects, and that overcome many of the disadvantages of prior art arrangements.

In brief, a method and apparatus are provided for utilizing error correction code (ECC) in a direct access storage device (DASD). A plurality of predetermined file conditions are identified. Each of the plurality of predetermined file conditions are related to a read data raw error rate. An ECC burst control is provided with an ECC engine for varying an ECC correction power of the ECC engine. The ECC correction power is selectively varied responsive to the identified predetermined file conditions.

BRIEF DESCRIPTION OF THE DRAWING

The present invention together with the above and other objects and advantages may best be understood from the following detailed description of the preferred embodiments of the invention illustrated in the drawings, wherein:

FIG. 5 is a chart illustrating a conventional customer data block;

FIG. 6 is a chart illustrating miscorrection probability for reading random data with different ECC correction powers enabled; and FIG. 7 is a chart illustrating the byte error rate dependency upon servo mode with different ECC correction powers enabled.

DETAILED DESCRIPTION OF THE PREFERRED EMBODIMENTS

Figure 1:
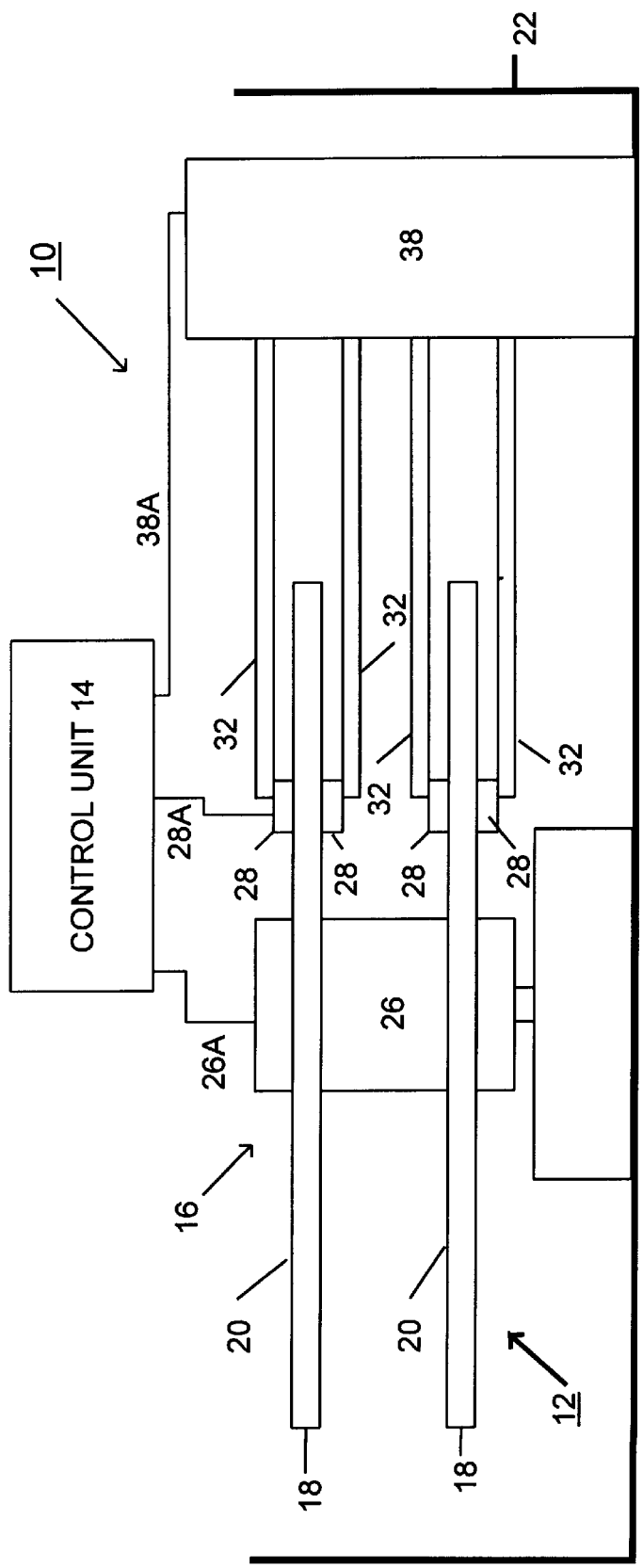
FIG. 1 is a schematic and block diagram of a data storage disk file embodying the present invention.
Figure 2:
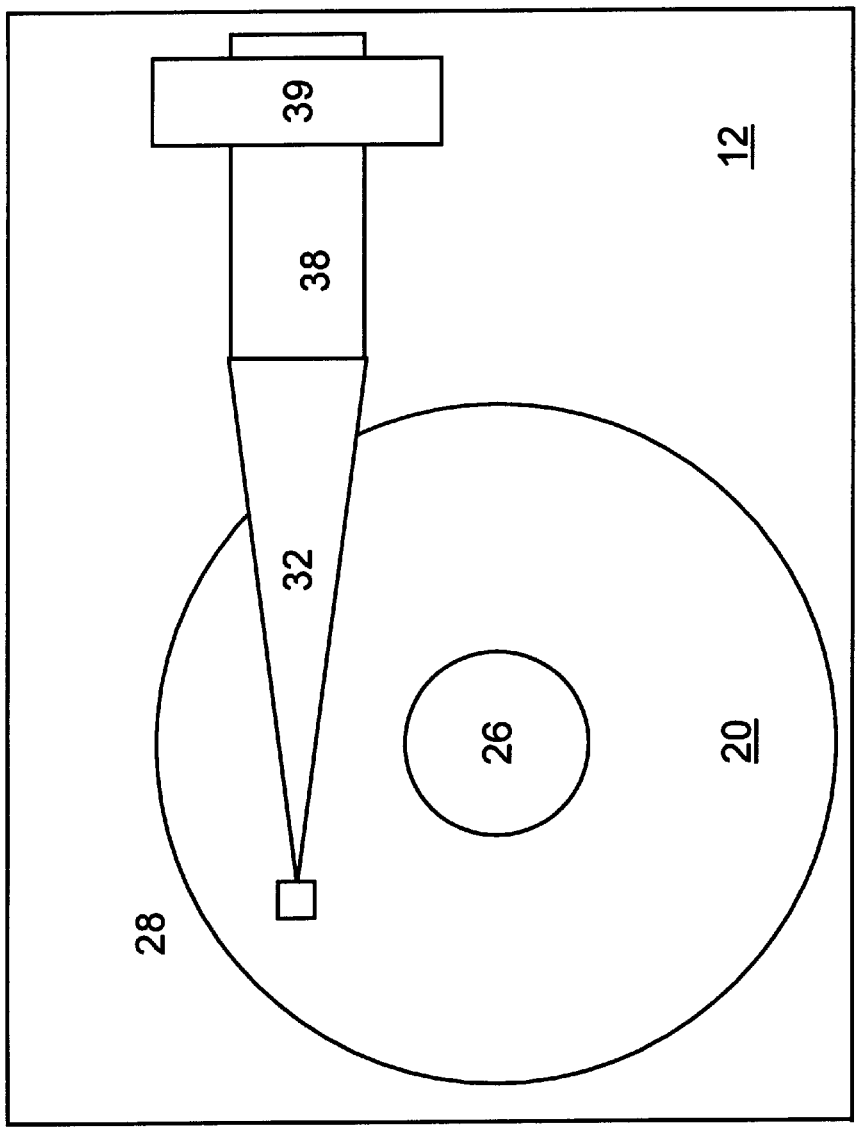
FIG. 2 is a schematic and block diagram showing the accessing mechanism for a single disk surface of the apparatus of FIG. 1.

Having reference now to the drawings, in FIG. 1 there is illustrated a data storage disk file generally designated as 10 including a rigid magnetic disk drive unit 12 and an interface control unit generally designated as 14. Unit 12 is illustrated in simplified and diagrammatic form sufficient for an understanding of the present invention. The utility of the present invention is not restricted to the details of a particular drive unit construction.

The disk drive unit 12 includes a stack 16 of disks 18 each having at least one magnetic surface 20. The disks 18 are mounted parallel to one another within a housing 22 for simultaneous rotation on and by an integrated spindle and motor assembly 26. Information on each magnetic disk surface 20 is read from or written to the disk surface 20 by a corresponding transducer head assembly 28 movable in a path having a radial component across the rotating disk surface 20.

Each transducer head assembly 28 is carried by an arm 32. The arms 32 are ganged together for simultaneous pivotal movement by a head drive servo motor 38 including a voice coil 39 cooperating with an internal magnet and core assembly. Drive signals applied to the voice coil 39 cause the arms 32 to move in unison to position the transducer head assemblies 28 in registration with information storage tracks on the disk surfaces 20 where information is written or read.

The disk drive unit 12 is controlled in operation by signals provided by the control unit 14, including motor control signals on line 26A and head position control signals on line 38A. In a typical arrangement, control unit 14 provides an interface with a computer that provides data read and write commands, and data signals are transmitted to or from the transducer head assemblies over corresponding lines 28A, one of which is seen in FIG. 1. Servo position information is recorded on the disk surfaces 20, and the transducer head assemblies 28 read this servo information to provide a servo position signal to the control unit 14. This information is employed by the control unit 14 to provide position control signals on line 38A. The purpose of this position feedback system is to assure accurate and continuous positioning of the transducer head assemblies 28 so that data is written to and read from precise locations on the disk surfaces 20.

Figure 3:
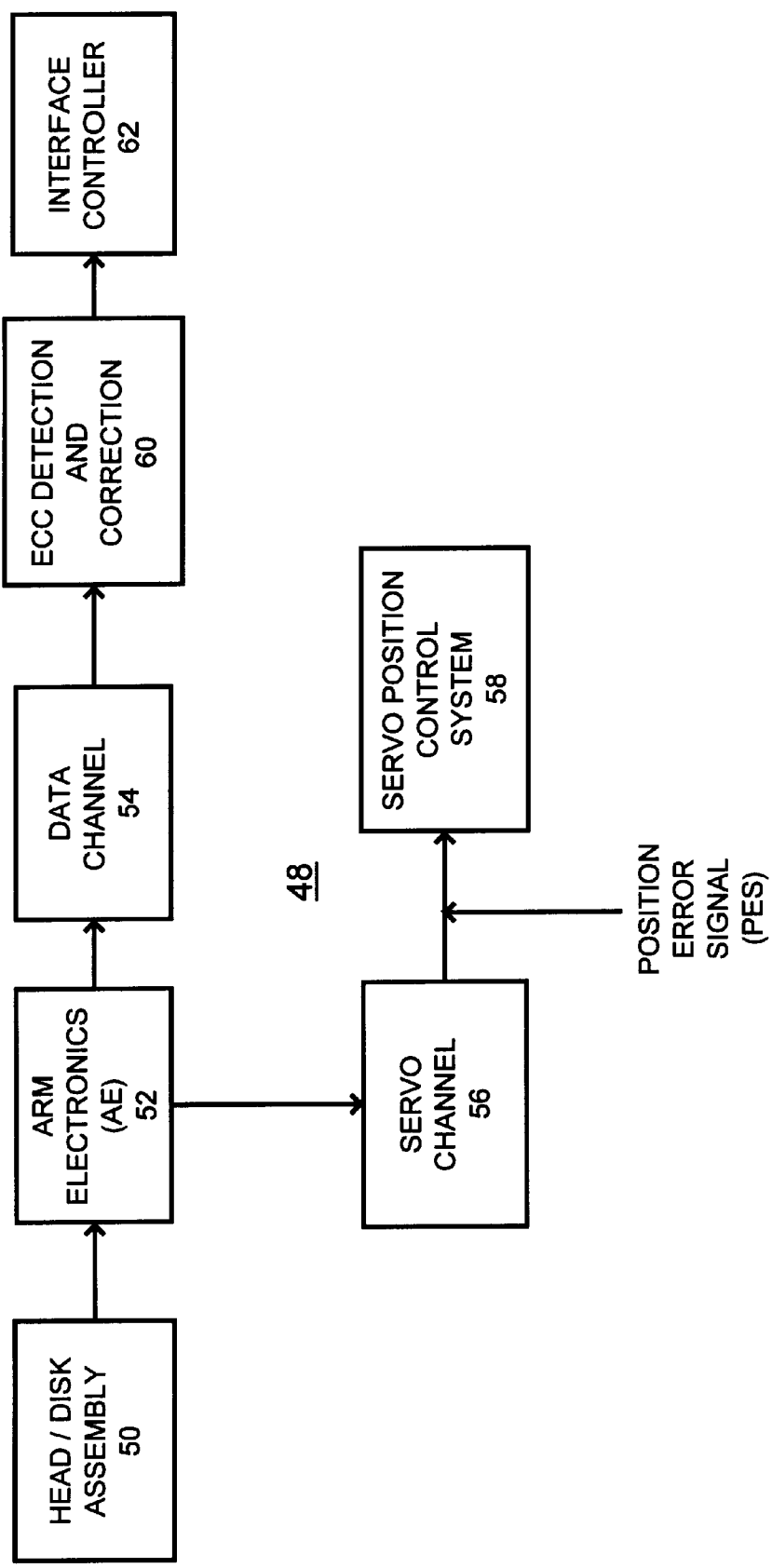
FIG. 3 is a block diagram functional representation illustrating a data channel of the data storage disk file of FIG. 1.

Referring now to FIG. 3, there is shown a block diagram functional representation of the disk file 10 generally designated as 48 for carrying out the error correction methods of the invention. Servo information and customer data are read by a head/disk assembly 50 and amplified by arm electronics (AE) 52. A data channel 54 uses known sampling techniques for detecting the readback signals from the disk that contain the customer data. A servo channel 56 provides a position error signal (PES) to a servo position control system 58. The servo position control system 58 performs servo control functions providing servo positioning control signals for the disk file 10. An error correcting code (ECC) detection and correction function 60 of the preferred embodiment is coupled between the data channel 54 and an interface controller 62 that performs interface processor functions.

Figure 4:
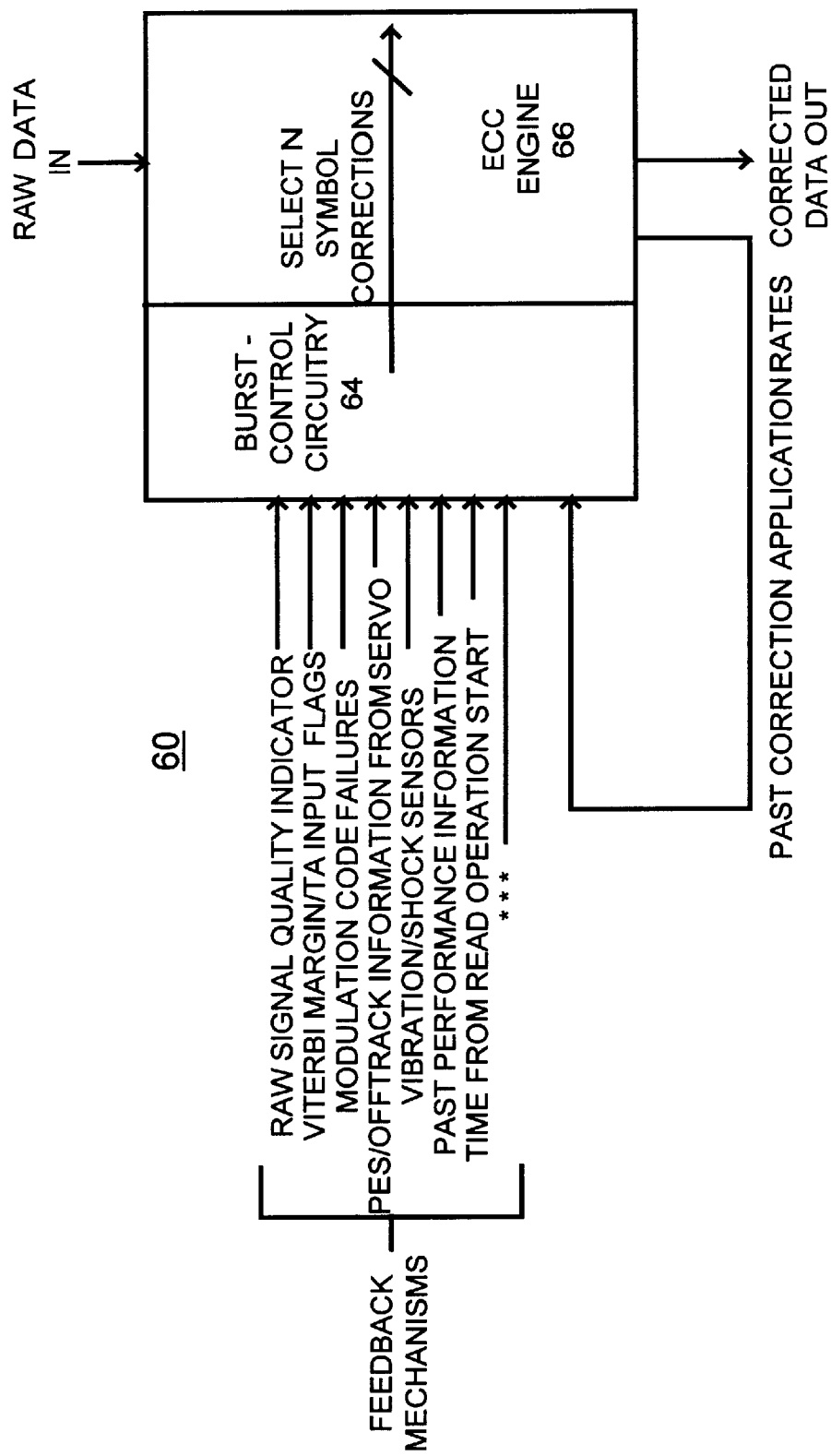
FIG. 4 is a block diagram illustrating an error correcting code (ECC) detection and correction block of the data channel of FIG. 3 of the invention.

Referring also to FIG. 4, in accordance with features of the preferred embodiment, ECC detection and correction function 60 provides an error detection and correction function to protect the integrity of the customer data from readback errors that are inherent in disk drives. The error detection and correction function 60 is accomplished by appending a predefined number N of ECC check bytes of error correcting code (ECC) to the end of the customer data block during a data write operation. The power of the ECC, that is the number of bytes the ECC can protect in a single block and the number of errors the ECC can safely detect and correct, is directly related to the number N of ECC check bytes recorded with the customer data block.

In accordance with features of the preferred embodiment, error detection and correction function 60 includes a burst control circuitry 64 providing a select N symbol corrections signal to an ECC engine 66. The select N symbol corrections signal is used to adjust the OTF ECC correction capability based on file conditions that can impact the raw error rate of data input to the ECC detection and correction function 60 to maintain an acceptable miscorrection rate. A variety of file conditions which conventionally are monitored for other reasons, are applied to the burst control circuitry 64 and used to control the ECC OTF correction power. A plurality of feedback mechanisms applied to the burst control circuitry 64 include a raw signal quality indicator, Viterbi margin and thermal asperity (TA) input flags, modulation code failures, position error signal (PES) and off-track or servo mode information from the servo position control system 58, vibration and shock sensors, past performance information, such as logged error rate, a timer value from a time from a read operation start and past correction application rates. Since the servo control system 58 is constantly measuring the position error signal (PES) plus servo mode including seek, settle, coarse on track and fine on track, this information is passed to the ECC burst control circuitry 64 for adjusting the OTF ECC capability to limit the miscorrection rate.

FIG. 5 shows an exemplary format for customer data block plus redundancy. In this example, there are 26 bytes of redundancy. Two 4 byte CRC check bytes plus a 3 way interleaved, 6 byte per interleave, 8 bit symbol Reed-Solomon (R-S) ECC code.

FIG. 6 is a chart illustrating miscorrection probability for reading random data with different ECC correction powers enabled. FIG. 6 shows how the miscorrection rate, for the illustrated code of FIG. 5, varies based upon the number of the check bytes in the R-S code that are used to detect errors and the correction power enabled of 1, 2, and 3 bursts per interleave used to correct OTF errors.

FIG. 7 shows how the miscorrection rate varies based upon whether the file 10 is in settle servo mode or ontrack servo mode. FIG. 7 illustrates the byte error rate dependency upon servo mode.

Figure 8:
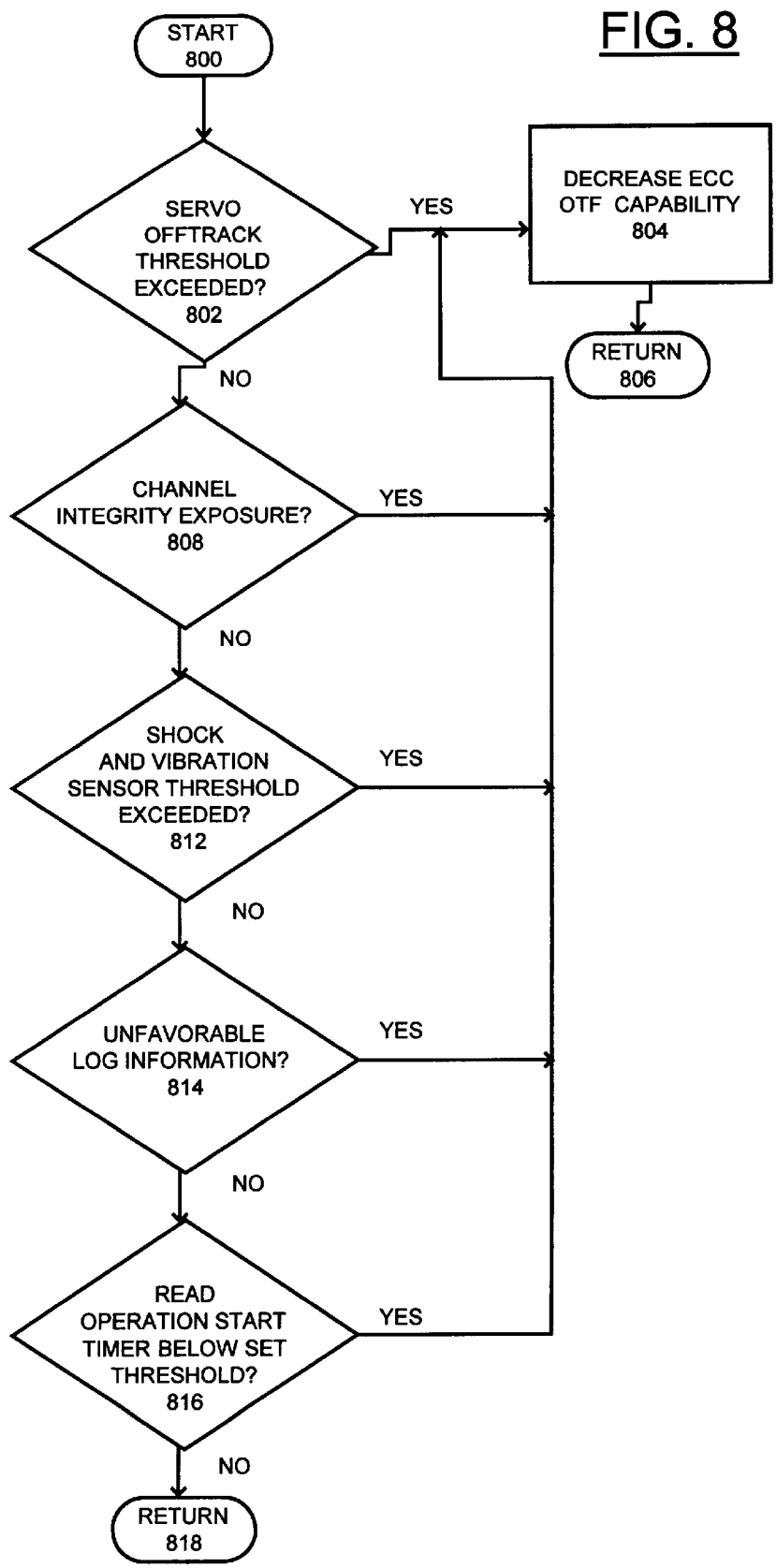
FIG. 8 is a functional flow chart illustrating exemplary steps performed by the error correcting code (ECC) detection and correction block of FIG. 4.

Referring also to FIG. 8, there are shown exemplary steps performed by the error correcting code (ECC) detection and correction function 60 beginning at a block 800. A servo offtrack threshold is checked as indicated at a decision block 802. When the predetermined servo offtrack threshold is exceeded, then the ECC OTF capability is decreased as indicated at a block 804. Then the operations return as indicated at a block 806. When the predetermined servo offtrack threshold is not exceeded, then the channel integrity exposure is checked as indicated at a decision block 808.

The channel integrity exposure checking includes a check of the feedback mechanisms including raw signal quality indicator, Viterbi margin and thermal asperity (TA) and modulation code failures. When an unfavorable channel integrity exposure is identified at decision block 808, then the ECC OTF capability is decreased at block 804 and the operations return at block 806. When an unfavorable channel integrity exposure is not identified at decision block 808, then a shock and vibration sensor threshold is checked as indicated at a decision block 812. When the shock and vibration sensor threshold has been exceeded, then the ECC OTF capability is decreased at block 804 and the operations return at block 806. When the shock and vibration sensor threshold has not been exceeded, then log information is checked as indicated at a decision block 814.

When an unfavorable historical file condition is identified at decision block 814, then the ECC OTF capability is decreased at block 804 and the operations return at block 806. When an unfavorable historical file condition is not identified at decision block 814, then a read operation start timer is checked as indicated at a decision block 816. When a timer value below a set threshold time value is identified at decision block 816, then the ECC OTF capability is decreased at block 804 and the operations return at block 806. Otherwise, the ECC OTF capability is not changed and the sequential operation return as indicated at a block 818.

In accordance with features of the preferred embodiment, error detection and correction function 60 advantageously can be used in a disk file 10 with the burst control circuitry 64 arranged to switch the OTF capability from 3 burst/interleave OTF correction while ontrack to 2 burst/interleave correction in settle. The error detection and correction function 60 with burst control circuitry 64 advantageously can maintain a relatively constant miscorrection rate for the disk file 10. It should be understood that other measurable file conditions could be used to adjust ECC power in the spirit of this invention.

While the present invention has been described with reference to the details of the embodiments of the invention shown in the drawing, these details are not intended to limit the scope of the invention as claimed in the appended claims.

What is claimed is:

1. A method for dynamically utilizing error correction code (ECC) in a direct access storage device (DASD) comprising the steps of:

identifying a plurality of predetermined file conditions in the direct access storage device (DASD); each of said plurality of predetermined file conditions being related to a read data raw error rate and including identifying position error signal and servo mode, said servo mode including seek and settle information;

providing an ECC burst control with an ECC engine for varying an ECC correction power; and dynamically, selectively varying said ECC correction power responsive to said identified predetermined file conditions in the direct access storage device (DASD).

2. A method for utilizing error correction code (ECC) as recited in claim 1 wherein said step of dynamically, selectively varying said ECC correction power includes the step of lowering said ECC correction power responsive to an identified servo settle mode and raising said ECC correction power responsive to an identified ontrack mode of the direct access storage device.

3. A method for utilizing error correction code (ECC) as recited in claim 1 wherein said step of identifying a plurality of predetermined file conditions in the direct access storage device (DASD) includes the step of identifying a raw signal quality indicator, said raw signal quality indicator provided by channel integrity exposure checking in the direct access storage device.

4. A method for utilizing error correction code (ECC) as recited in claim 1 wherein said step of identifying a plurality of predetermined file conditions in the direct access storage device (DASD) includes the step of identifying Viterbi margin and thermal asperity input flags, said Viterbi margin and said thermal asperity input flags provided by channel integrity exposure checking in the direct access storage device.

5. A method for utilizing error correction code (ECC) as recited in claim 1 wherein said step of identifying a plurality of predetermined file conditions in the direct access storage device (DASD) includes the step of identifying a modulation code failure, said modulation code failure being identified by channel integrity exposure checking in the direct access storage device.

6. A method for utilizing error correction code (ECC) as recited in claim 1 wherein said step of identifying a plurality of predetermined file conditions in the direct access storage device (DASD) includes the step of identifying a timer value for a time from a read operation start in the direct access storage device.

7. A method for utilizing error correction code (ECC) as recited in claim 1 wherein said step of identifying a plurality of predetermined file conditions in the direct access storage device (DASD) includes the step of identifying past performance information in the direct access storage device.

8. A method for utilizing error correction code (ECC) as recited in claim 1 wherein said step of dynamically, selectively varying said ECC correction power includes the step of lowering said ECC correction power responsive to an identified unfavorable channel integrity exposure in the direct access storage device (DASD).

9. A method for utilizing error correction code (ECC) as recited in claim 1 wherein said step of dynamically, selectively varying said ECC correction power includes the step of lowering said ECC correction power responsive to an identified exceeded shock and vibration sensor threshold in the direct access storage device (DASD).

10. A method for utilizing error correction code (ECC) as recited in claim 1 wherein said step of dynamically, selectively varying said ECC correction power includes the step of lowering said ECC correction power responsive to an identified unfavorable historical file condition in the direct access storage device (DASD).

11. A method for utilizing error correction code (ECC) as recited in claim 1 wherein said step of dynamically, selectively varying said ECC correction power includes the step of lowering said ECC correction power responsive to an identified read operation start timer value below a set threshold time value in the direct access storage device (DASD).

12. Apparatus for dynamically utilizing error correction code (ECC) in a direct access storage device (DASD) comprising:

an ECC engine, said ECC engine receiving raw data and providing corrected data in the direct access storage device (DASD);

an ECC burst control coupled to said ECC engine for dynamically, selectively varying an ECC correction power of said ECC engine; and a plurality of feedback mechanisms coupled to said ECC burst control, said ECC burst control being responsive to said plurality of feedback mechanisms for dynamically, selective varying said ECC correction power of said ECC engine; and said feedback mechanisms including indicators for an ontrack mode and a settle mode of the direct access storage device and means for identifying a position error signal and servo mode information in the direct access storage device, said servo mode information including seek and settle information.

13. Apparatus for utilizing error correction code (ECC) in a direct access storage device (DASD) as recited in claim 12 wherein said plurality of feedback mechanisms coupled to said ECC burst control include means for identifying channel integrity exposure in the direct access storage device.

14. Apparatus for utilizing error correction code (ECC) in a direct access storage device (DASD) as recited in claim 12 wherein said plurality of feedback mechanisms coupled to said ECC burst control include means for identifying Viterbi margin and thermal asperity input flags in the direct access storage device.

15. Apparatus for utilizing error correction code (ECC) in a direct access storage device (DASD) as recited in claim 12 wherein said plurality of feedback mechanisms coupled to said ECC burst control include means for identifying a raw signal quality indicator in the direct access storage device.

16. Apparatus for utilizing error correction code (ECC) in a direct access storage device (DASD) as recited in claim 12 wherein said plurality of feedback mechanisms coupled to said ECC burst control include means for identifying a modulation code failure in the direct access storage device.

17. Apparatus for utilizing error correction code (ECC) in a direct access storage device (DASD) as recited in claim 12 wherein said plurality of feedback mechanisms coupled to said ECC burst control include means for identifying a timer value for a time from a read operation start in the direct access storage device.

18. Apparatus for utilizing error correction code (ECC) in a direct access storage device (DASD) as recited in claim 12 wherein said plurality of feedback mechanisms coupled to said ECC burst control include means for identifying past performance information in the direct access storage device.

* * * * *